United States Patent
Gumm

(12) 
(10) Patent No.: US 6,472,945 B1
(45) Date of Patent: Oct. 29, 2002

(54) OPERATIONAL AMPLIFIER OSCILLATOR

(75) Inventor: Linley F. Gumm, Beaverton, OR (US)

(73) Assignee: Tektronix, Inc., Beaverton, OR (US)

(*) Notice: Subject to any disclaimer, the term of this patent is extended or adjusted under 35 U.S.C. 154(b) by 0 days.

(21) Appl. No.: 09/844,376

(22) Filed: Apr. 27, 2001

(51) Int. Cl.[7] .............................. H03B 5/14; H03B 5/38; H03B 5/42
(52) U.S. Cl. ....................................... 331/138; 331/139
(58) Field of Search ................................. 331/138–142

(56) References Cited

U.S. PATENT DOCUMENTS

| | | | | |
|---|---|---|---|---|
| 4,038,609 A | * | 7/1977 | Langberg | 331/65 |
| 4,358,742 A | * | 11/1982 | Ferriss | 331/158 |
| 4,661,785 A | * | 4/1987 | Benjaminson | 331/109 |
| 4,782,309 A | * | 11/1988 | Benjaminson | 331/139 |

* cited by examiner

*Primary Examiner*—David Mis
(74) *Attorney, Agent, or Firm*—Francis I. Gray

(57) ABSTRACT

An operational amplifier oscillator uses an operational amplifier as a low impedance driver for a resonator, the output from the operational amplifier being a voltage signal at the desired frequency. The operational amplifier has positive and negative feedback paths, with the negative feedback path having a first resistor for driving the impedance at the negative input to a small value when the voltage signal is near a zero crossing and an anti-parallel diode limiter in parallel with the first resistor with an optional series second resistor for driving the impedance at the negative input even smaller when the voltage signal swings away from zero. The positive feedback loop includes a series diode limiter or optional voltage divider. Phase noise is minimized by coupling a filter between the output and the positive feedback path to block the low frequency noise from the positive input of the amplifier.

25 Claims, 3 Drawing Sheets

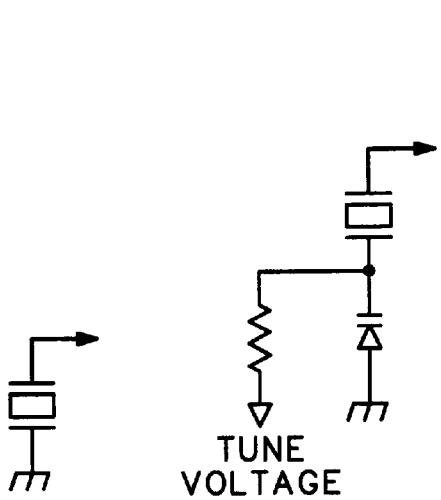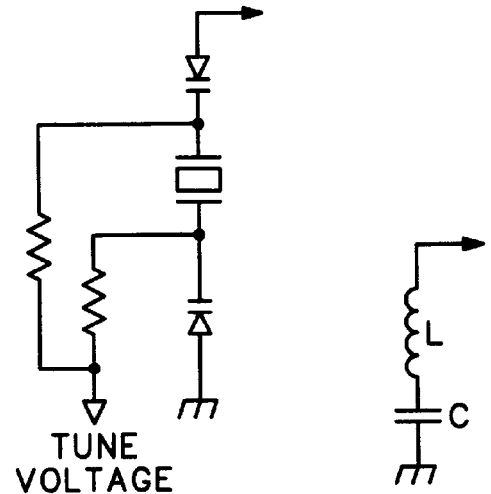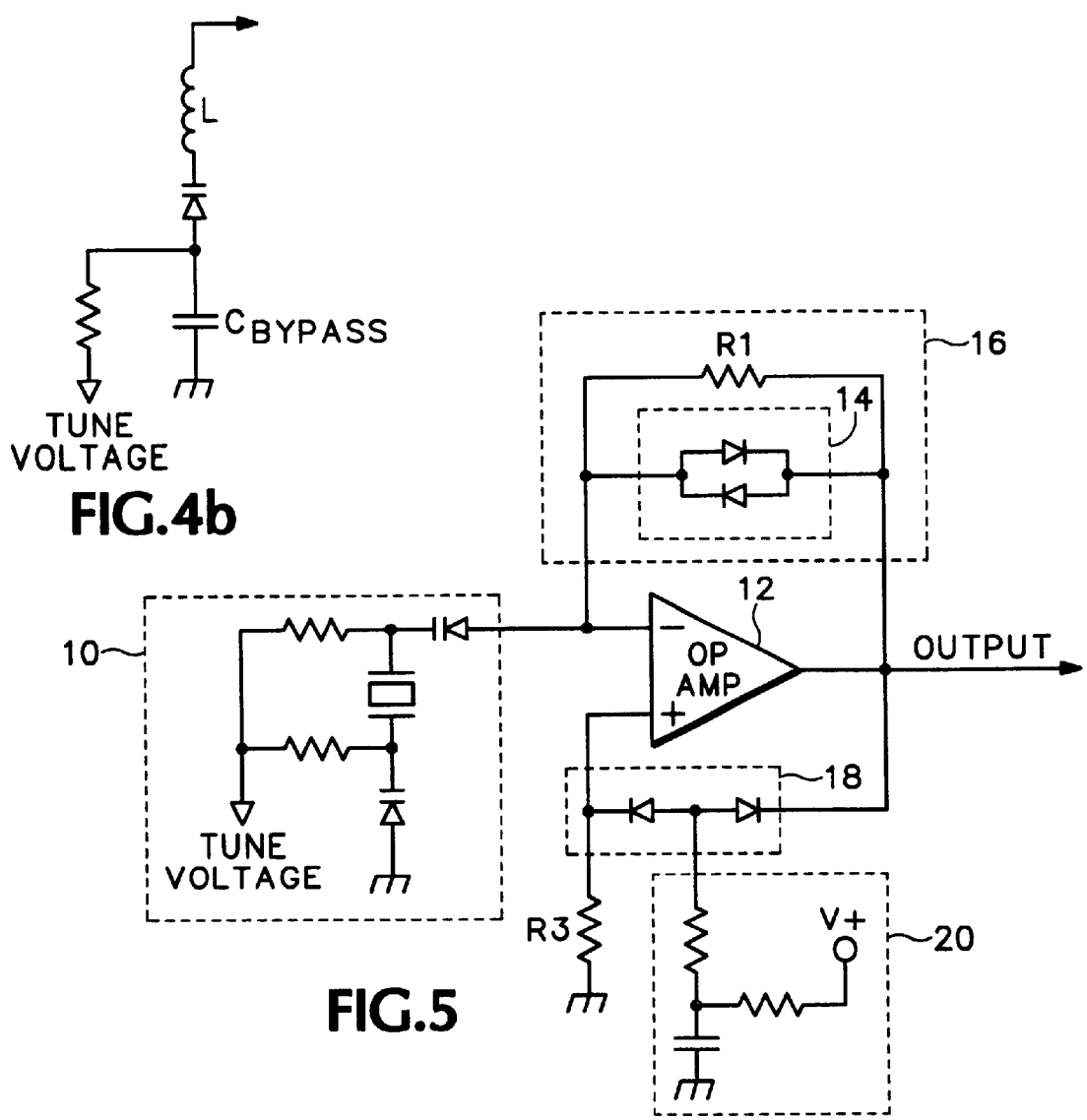

OPERATIONAL AMPLIFIER OSCILLATOR

BACKGROUND OF THE INVENTION

The present invention relates to oscillators, and more particularly to an operational amplifier oscillator for implementation as an integrated circuit.

Most oscillator circuits use discreet devices, such as individual transistors. Such oscillators generally have excellent phase noise characteristics. However more compact circuits with fewer elements are needed.

Another reoccurring problem, especially in the design of crystal oscillators, is to control the amount of energy dissipated in the resonator that determines the operating frequency. Crystal circuits must strictly limit the amount of energy dissipated in the crystal, typically about 1 mW. The same is true in LC oscillators using varactor diodes. The RF voltage across the varactor must be carefully limited to prevent forward biasing the diode.

A further problem occurs in voltage tuned crystal oscillators (VXCO) where a considerable amount of gain is sometimes required for operation across the tuning range to overcome the losses caused by component and board losses. Any loss creates an equivalent resistance that appears in series with the quartz crystal. Multiple transistors are required to achieve sufficient gain, causing design complication and consuming large circuit board areas devoted to the VXCO function.

Most integrated circuits used to create oscillators take the form of the typical microprocessor clock circuit—the I/O terminals of logic gates are provided to be configured as oscillators. These resonator circuits typically use a shunt capacitor and a series quartz crystal followed by another shunt capacitor.

What is desired is an oscillator implementable in an integrated circuit having a simple topology that allows independently setting the resonator power and gives low to very low phase noise.

BRIEF SUMMARY OF THE INVENTION

Accordingly the present invention provides an operational amplifier oscillator that uses an operational amplifier to provide a low impedance source for a resonator while providing an output voltage signal at the desired frequency. The operational amplifier has positive and negative feedback paths, with the negative feedback path having a first path for driving the input impedance at the negative input to a small value when the output voltage signal is near a zero crossing and having a second path for driving the input impedance even smaller when the output voltage signal swings away from the zero crossing. A filter between the output and the positive feedback path is used to minimize phase noise by blocking low frequency noise in the output of the amplifier from the positive input of the amplifier.

The objects, advantages and other novel features of the present invention are apparent from the following detailed description when read in light of the appended claims and attached drawing.

BRIEF DESCRIPTION OF THE SEVERAL VIEWS OF THE DRAWING

FIGS. 3a, 3b and 3c are schematic views of crystal resonator circuits that may be used in the operational amplifier oscillator according to the present invention.

FIGS. 4a and 4b are schematic views of LC resonator circuits that may be used in the operational amplifier oscillator according to the present invention.

FIG. 5 is a detailed schematic view of the first embodiment of the operational amplifier oscillator using a crystal resonator according to the present invention.

DETAILED DESCRIPTION OF THE INVENTION

Figure 1:
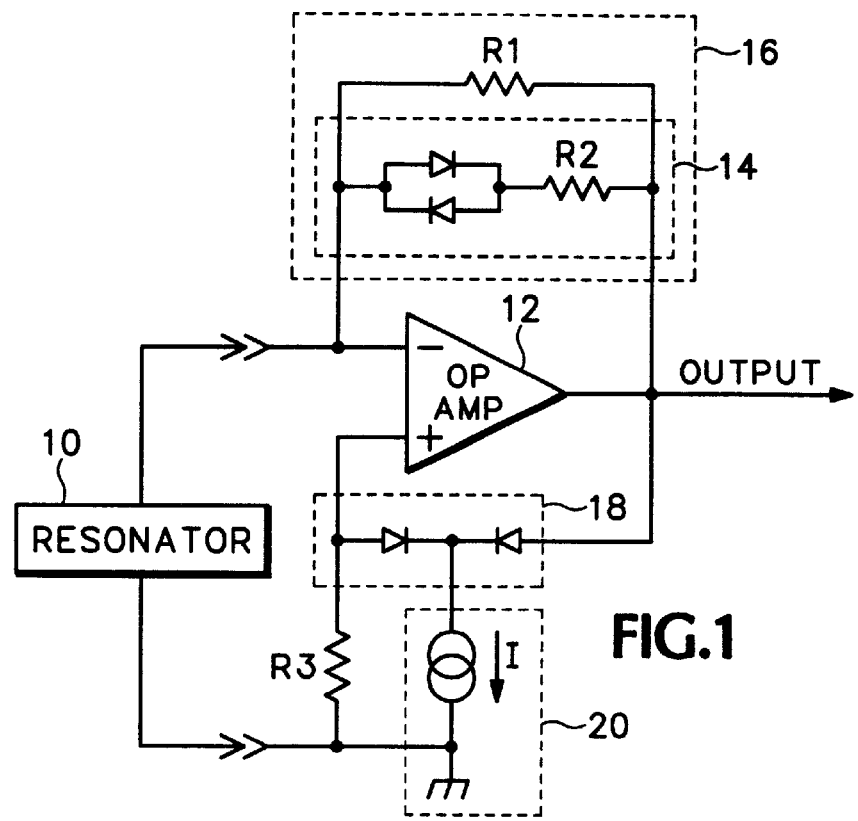
FIG. 1 is a circuit schematic view of a first embodiment of an operational amplifier oscillator according to the present invention.
Figure 2:
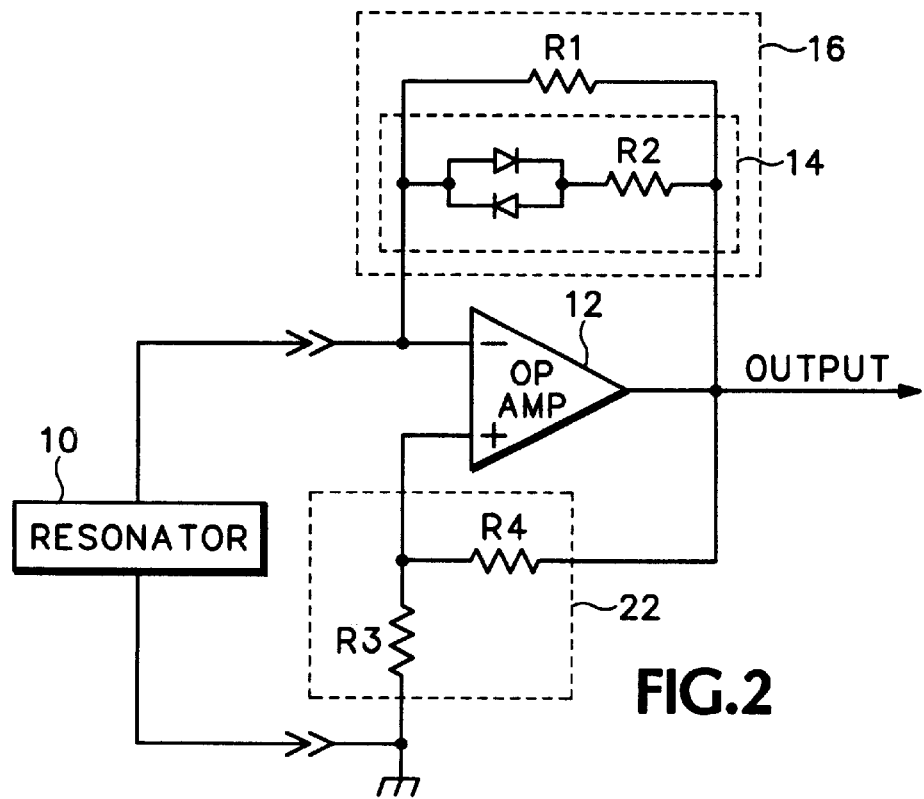
FIG. 2 is a circuit schematic view of a second embodiment of an operational amplifier oscillator according to the present invention.

Referring now to FIGS. 1 and 2 operational amplifier oscillator circuits are shown that are useful to create crystal or LC oscillators up to a few ten's of Megahertz frequency. These circuits use a common operational amplifier. For frequencies above a Megahertz or so a current feedback operational amplifier may be a better choice because of the low input impedance, typically about 50 Ohms, and the broad frequency response.

A resonator 10 is coupled as an input to an operational amplifier 12. The resonator 10 provides a series resonance, i.e., low impedance at a zero phase, at only the desired frequency. To use the resonator Q to its best advantage, the resonator 10 must be driven from a low impedance voltage source. A key is to voltage drive the circuit from a low impedance source while using the current flowing through the resonator 10 to control the voltage source's phase. Another key is to use an anti-parallel diode limiter 14 with a parallel resistance R1 in a negative feedback path 16 of the operational amplifier 12.

The parallel resistance R1 provides sufficient feedback to the negative input of the operational amplifier 12 to drive its input impedance down to a small value, even when the output voltage is near ground, i.e., the diodes are open. As the voltage swings away from ground, R2 and the anti-parallel diode limiter 14 increases the amount of feedback, driving the input impedance to even lower values. R2 is used to keep the operational amplifier 12 from oscillating on its own when the anti-parallel diode limiter 14 is conducting. The operational amplifier 12 may break into VHF oscillation if the feedback impedance is very low and the resonator's shunt impedance is very high. If there is a reasonable amount of out-of-band shunt admittance, R2 may not be required.

In FIG. 1 a series diode limiter 18 connects a portion of the output signal to the amplifier's positive input, changing the voltage at the positive input, in phase with the current in the resonator 10. The voltage swing at the positive input is set by the value of resistor R3 and the bias current of the series diode limiter 18. The negative feedback provided by R1, R2 and the anti-parallel diode limiter 14 also causes the voltage at the negative input to be equal to that of the positive input, thus driving the resonator 10 from a low impedance source.

The series diode limiter 18 may not be required if the best performance is not needed. This is shown in FIG. 2 where a simple resistive voltage divider 22 replaces the series diode limiter 18. The anti-parallel diode limiter 14 now provides limiting functions for both feedback paths. There is more amplitude uncertainty in the resonator drive level and the resistive connection increases the effects of the amplifier's audio noise on the circuit's operation, increasing its phase noise.

FIGS. 3*a*, 3*b* and 3*c* show appropriate resonator circuits 10 for use with the operational amplifier 12 as a crystal oscillator (XO) (FIG. 3*a*) or a voltage controlled crystal oscillator (VCXO) (FIGS. 3*b* and 3*c*). When used with crystal resonators R2 may not be required to control the amplifier's self oscillation.

Likewise FIGS. 4*a* and 4*b* show appropriate resonator circuits 10 for use with the operational amplifier 12 as a fixed tuned LC oscillator (FIG. 4*a*) or as a voltage controlled oscillator (VCO) (FIG. 4*b*). In the case of the VCO a capacitor between the varactor and ground provides a bypass. This allows biasing both ends of the varactor diode without requiring a connection to the high impedance node between the inductor and the varactor. Any practical connection to this high impedance node causes signal loss that appears in the form of equivalent series resistance in the series resonator path, which lowers the oscillator's loaded Q, raising the phase noise. By being able to connect at the very low impedance point between the varactor and its bypass capacitor, the varactor may be biased without decreasing the Q while using a small resistor to limit the amount of noise caused by the varactor's leakage current. This option is often not available in oscillator circuits using two RF connections to the resonator.

FIG. 5 is an example of an actual circuit. R2 is not required because of the wide band shunt capacitance provided by the varactors and the quartz crystal. The series diode limiter 18 drives the amplifier's positive input with a 160 mV peak-to-peak square wave that limits the crystal's dissipation to less than 1 mW. The feedback path provided by R1 drives the amplifier's nominal 50 Ohm input impedance down to less than 2 Ohms at zero crossing and well below that when the anti-parallel diode limiter 14 is in limit. This allows the loop with the crystal and the varactor diodes to operate at maximum Q through the RF cycle. The crystal-varactor topology, placing the varactors symmetrically around the crystal, is optimal in terms of the amount of series resistance inserted in the crystal loop by the varactor bias network that uses large resistors to bias the varactors.

Figure 6:
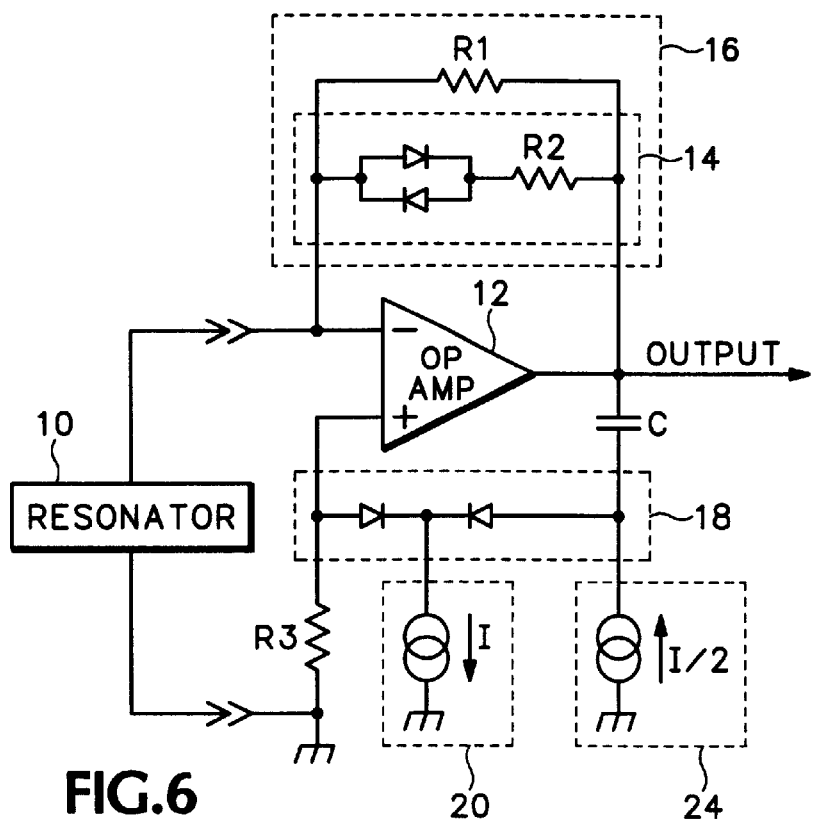
FIG. 6 is a schematic view of a first extension for minimizing phase noise in the first embodiment of the operational amplifier oscillator according to the present invention.

A topological extension of the basic operational amplifier oscillator circuit is shown in FIG. 6. This topology is designed to minimize phase noise caused by the amplifier's audio frequency output noise. Depending on the details of the resonator 10 and the amount of negative feedback, the amplifier's low frequency or audio gain may be relatively high. This means that the audio frequency noise is amplified and appears at the input to the series diode limiter 18. In FIG. 1 this noise adds to the RF signal at the series diode limiter's input, causing the zero crossing of the RF signal to shift slightly in time. This causes phase modulation as a function of audio noise or phase noise. To limit or eliminate the effect a capacitor C is inserted between the output of the operational amplifier 12 and the input to the series diode limiter 18. A current source 24 also is added to correctly bias the series diode limiter 18. If the size of the capacitor C is selected so that it is essentially a short circuit at the RF frequency and an open circuit at audio frequencies, the series diode limiter 18 is isolated from the amplifier's noise.

Figure 7:
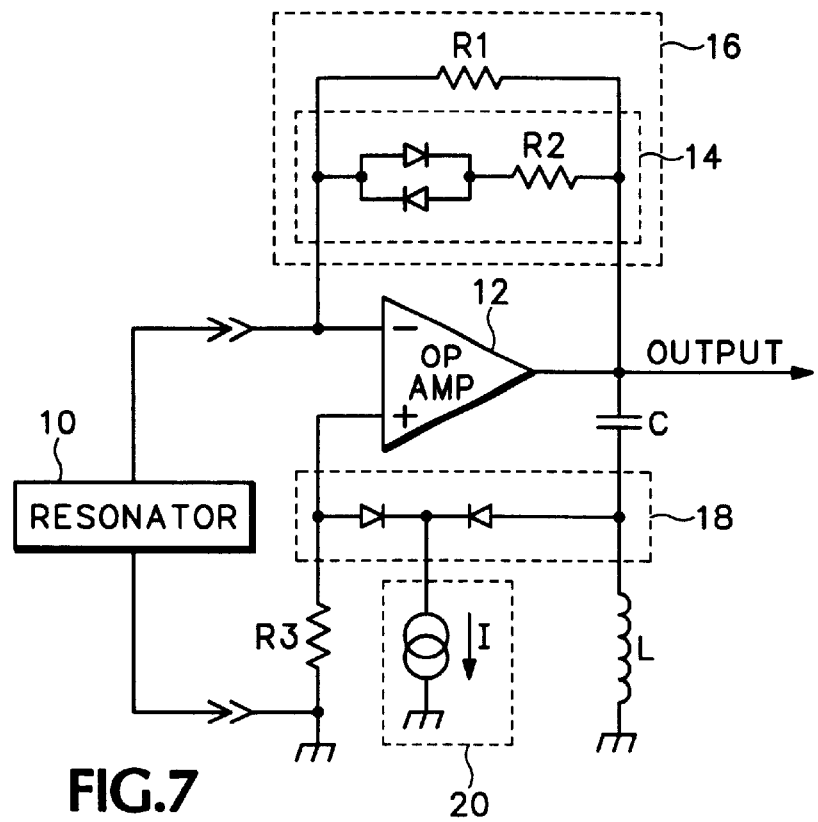
FIG. 7 is a schematic view of a second extension for minimizing phase noise in the first embodiment of the operational amplifier oscillator according to the present invention.

A more complex high pass filter, such as the two-pole filter shown in FIG. 7, may be substituted for the capacitor C of FIG. 6. Even more complex filters may be used. Care needs to be taken not to affect the RF carrier's phase while rejecting the amplifier's audio noise.

Thus the present invention provides an operational amplifier oscillator suitable for implementation in an integrated circuit by using an operational amplifier as the gain device for a frequency resonator at the desired frequency, where the operational amplifier is a low-Z source for driving the resonator.

What is claimed is:

1. An operational amplifier oscillator comprising:

a frequency resonator; and an operational amplifier having a low impedance input coupled to the frequency resonator for driving the frequency resonator and having as an output a voltage signal at a desired frequency.

2. The operational amplifier oscillator as recited in claim 1 wherein the operational amplifier comprises an amplifier having a positive input, a negative input coupled to the resonator and an output to provide the voltage signal with the output being coupled to the positive input to provide a positive feedback path and with the output being coupled to the negative input to provide a negative feedback path for driving an input impedance of the amplifier to a low value to produce the low impedance input.

3. The operational amplifier oscillator as recited in claim 2 wherein the negative feedback path comprises:

first means for driving the input impedance of the amplifier to a small value when the voltage signal at the output is near a reference potential; and second means in parallel with the first means for driving the input impedance of the amplifier to even smaller values as the voltage signal swings away from the reference potential.

4. The operational amplifier oscillator as recited in claim 3 wherein the first driving means comprises a first resistor coupled between the output and the negative input of the amplifier.

5. The operational amplifier oscillator as recited in claims 3 or 4 wherein the second driving means comprises an anti-parallel diode limiter coupled between the output and the negative input of the amplifier.

6. The operational amplifier oscillator as recited in claim 5 wherein the second driving means further comprises a second resistor coupled in series with the anti-parallel diodes between the output and the negative input of the amplifier.

7. The operational amplifier oscillator as recited in claims 2 or 3 wherein the positive feedback path comprises:

a series diode limiter coupled between the output and the positive input of the amplifier;

a current source coupled to a node between the diodes in the series diode limiter; and a third resistor coupled between the positive input and the reference potential.

8. The operational amplifier oscillator as recited in claim 4 wherein the positive feedback path comprises:

a series diode limiter coupled between the output and the positive input of the amplifier;

a current source coupled to a node between the diodes in the series diode limiter; and a third resistor coupled between the positive input and the reference potential.

9. The operational amplifier oscillator as recited in claim 5 wherein the positive feedback path comprises:

a series diode limiter coupled between the output and the positive input of the amplifier;

a current source coupled to a node between the diodes in the series diode limiter; and a third resistor coupled between the positive input and the reference potential.

10. The operational amplifier oscillator as recited in claims 2 or 3 wherein the positive feedback path comprises a resistive voltage divider coupled between the output and the reference potential with a node between resistors in the resistive voltage divider being coupled to the positive input of the amplifier.

11. The operational amplifier oscillator as recited in claim 4 wherein the positive feedback path comprises a resistive voltage divider coupled between the output and the reference potential with a node between resistors in the resistive voltage divider being coupled to the positive input of the amplifier.

12. The operational amplifier oscillator as recited in claim 5 wherein the positive feedback path comprises a resistive voltage divider coupled between the output and the reference potential with a node between resistors in the resistive voltage divider being coupled to the positive input of the amplifier.

13. The operational amplifier as recited in claim 1 further comprising means coupled to the output for filtering out low frequency phase noise in the voltage signal.

14. The operational amplifier as recited in claims 2 or 3 comprising means coupled between the output and the positive feedback path for filtering out low frequency phase noise in the voltage signal.

15. The operational amplifier as recited in claim 14 wherein the filtering means comprises:

a capacitor coupled between the output and the series diode limiter; and a current source coupled to a node between the capacitor and the series diode limiter.

16. The operational amplifier as recited in claim 14 wherein the filtering means comprises:

a capacitor coupled between the output and the series diode limiter; and an inductor having one end coupled to a node between the capacitor and series diode limiter and the other end coupled to the reference potential.

17. The operational amplifier as recited in claim 4 comprising means coupled between the output and the positive feedback path for filtering out low frequency phase noise in the voltage signal.

18. The operational amplifier as recited in claim 17 wherein the filtering means comprises:

a capacitor coupled between the output and the series diode limiter; and a current source coupled to a node between the capacitor and the series diode limiter.

19. The operational amplifier as recited in claim 17 wherein the filtering means comprises:

a capacitor coupled between the output and the series diode limiter; and an inductor having one end coupled to a node between the capacitor and series diode limiter and the other end coupled to the reference potential.

20. The operational amplifier as recited in claim 5 comprising means coupled between the output and the positive feedback path for filtering out low frequency phase noise in the voltage signal.

21. The operational amplifier as recited in claim 20 wherein the filtering means comprises:

a capacitor coupled between the output and the series diode limiter; and a current source coupled to a node between the capacitor and the series diode limiter.

22. The operational amplifier as recited in claim 20 wherein the filtering means comprises:

a capacitor coupled between the output and the series diode limiter; and an inductor having one end coupled to a node between the capacitor and series diode limiter and the other end coupled to the reference potential.

23. The operational amplifier as recited in claim 7 comprising means coupled between the output and the positive feedback path for filtering out low frequency phase noise in the voltage signal.

24. The operational amplifier as recited in claim 23 wherein the filtering means comprises:

a capacitor coupled between the output and the series diode limiter; and a current source coupled to a node between the capacitor and the series diode limiter.

25. The operational amplifier as recited in claim 23 wherein the filtering means comprises:

a capacitor coupled between the output and the series diode limiter; and an inductor having one end coupled to a node between the capacitor and series diode limiter and the other end coupled to the reference potential.

* * * * *